March 15, 1966 J. KEMENY 3,240,182

FINE TUNING COUPLING APPARATUS FOR A TELEVISION RECEIVER

Filed Jan. 16, 1962 2 Sheets-Sheet 1

INVENTOR:
JULIUS KEMENY,
BY Joseph Levinson
HIS ATTORNEY.

March 15, 1966 J. KEMENY 3,240,182

FINE TUNING COUPLING APPARATUS FOR A TELEVISION RECEIVER

Filed Jan. 16, 1962 2 Sheets-Sheet 2

INVENTOR:
JULIUS KEMENY,
BY Joseph Levinson
HIS ATTORNEY.

3,240,182

FINE TUNING COUPLING APPARATUS FOR A TELEVISION RECEIVER

Julius Kemeny, Liverpool, N.Y., assignor to General Electric Company, a corporation of New York Filed Jan. 16, 1962, Ser. No. 166,548
9 Claims. (Cl. 116—124.4)

Figures 1, 2, 3, 4, 5, 6, 9:
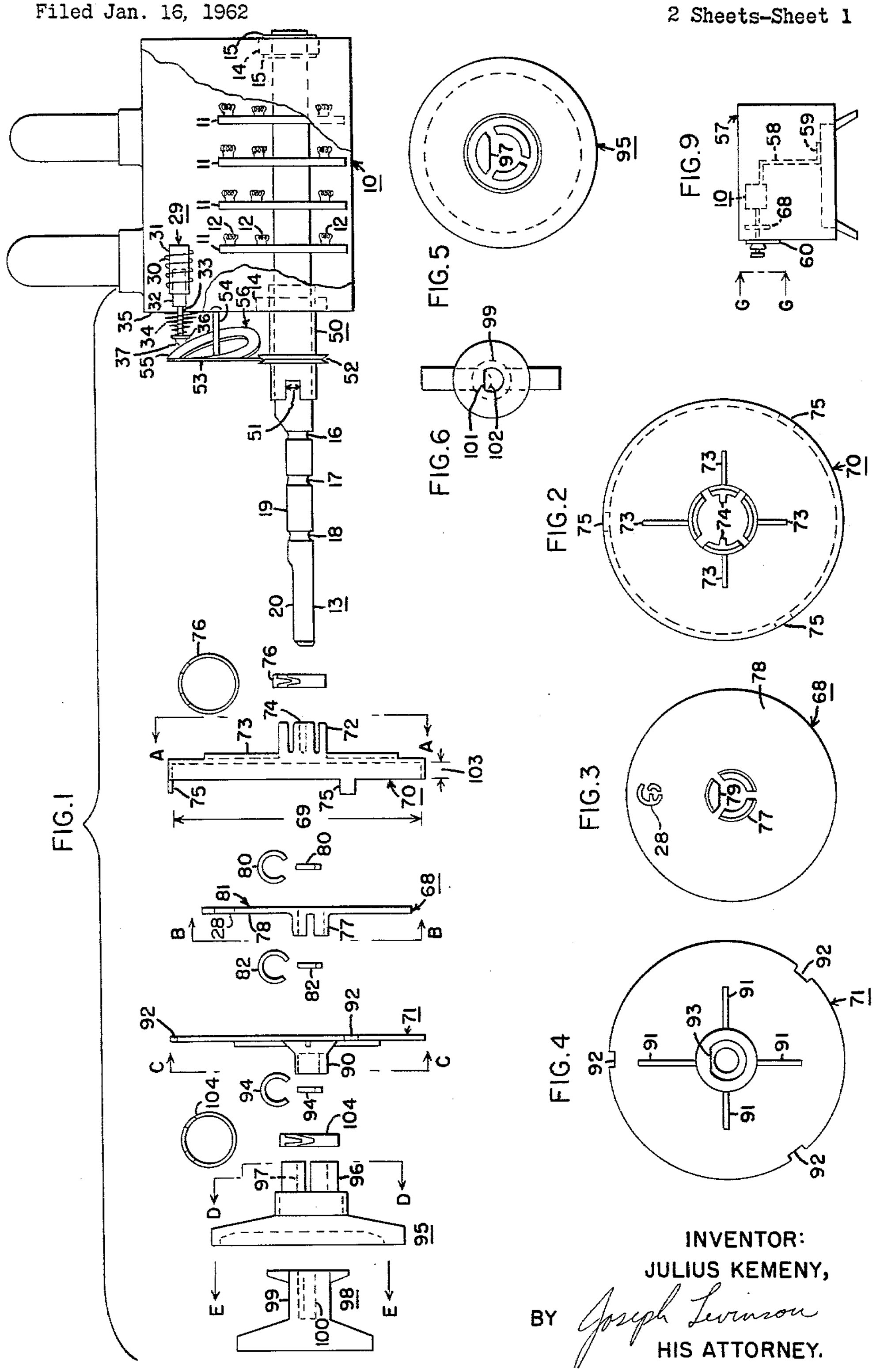

The present invention relates to apparatus for fine tuning a television receiver, and more particularly to means for coupling a manual fine tuning force to a fine tuning means in the tuning apparatus.

In a television receiver, means are known for readily indicating a selected program channel both when a viewing area is dimly lighted and when a viewer is at a relatively remote distance from the receiver. A system providing these characteristics utilizes an opaque circular disk mounted on a program channel selector drive shaft and is rotatable therewith. The disk is positioned on the shaft within a cabinet enclosing the receiver intermediate a viewing window provided in a control panel of the receiver and a light source also positioned within the receiver. Relatively large numeral shaped apertures are included in the disk and are positioned annularly and in numerical sequence about the disk near its periphery. Light from the source passes through the disk via a corresponding numeral aperture of a selected program channel and the numeral is thereby displayed at the window for convenient viewing.

In order to provide an attractive television receiver cabinet, it is desirable to position a control knob for manual fine tuning of the receiver concentric with and about the program channel selector shaft. It is also desirable to provide 360° rotation of the fine tuning knob. The positioning of the aforementioned relatively large disk on the program channel selector shaft prohibits the use of conventional means such as a unitary concentric shaft surrounding the program channel selector shaft for coupling a fine tuning force from the control panel to a fine tuning means in the receiver tuning apparatus. Furthermore, a fine tuning coupling means must be provided which does not interfere with the display of the selected program channel indication at the viewing window.

Accordingly, it is an object of this invention to provide a relatively simple and inexpensive means for coupling a manual fine tuning force to a fine tuning means in a television receiver, the receiver having a program channel indicating disk mounted on a program channel selector drive shaft and positioned within the television receiver cabinet.

Another object of this invention is to provide means for coupling a manual fine tuning force to a fine tuning means in a television receiver having a program channel indicating disk positioned within the receiver cabinet and mounted on a program channel selector drive shaft while simultaneously permitting continuously unobstructed display of a program channel indicating numeral at a viewing window.

In accordance with this invention, in a television receiver having a cabinet, a tuner positioned within the cabinet and having a program channel selector drive shaft, and a program channel indicating disk mounted at a position on the drive shaft within the cabinet, a composite tubular fine tuning drive shaft is provided and positioned concentrically with the program channel selector drive shaft. The fine tuning drive shaft includes indicator disk circumventing means for coupling a fine tuning drive force from a control panel of the receiver to a fine tuning means in the receiver while providing unobstructed viewing of a selected program channel indication provided by the disk.

Figure 10:
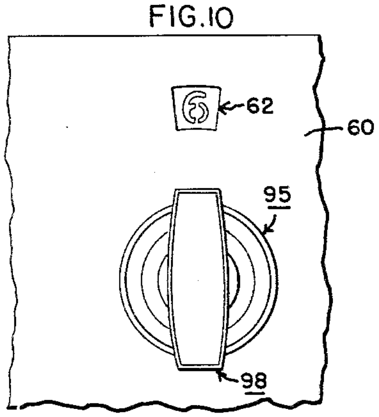
Figure 8:
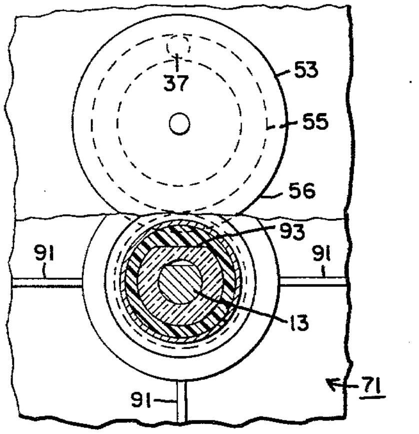
Figure 7:
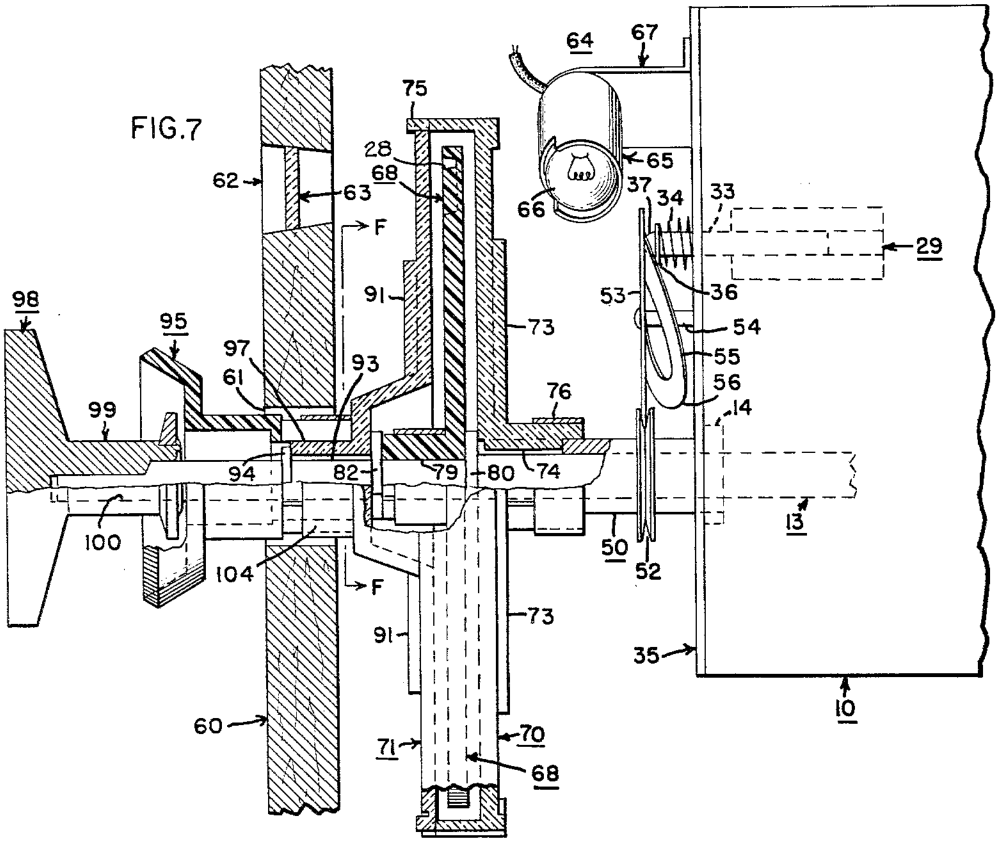

Further objects, features and the attending advantages of the invention will be apparent with reference to the following specification and drawings in which:

FIGURE 1 is an exploded view of a television program channel tuner, partially cut-away, and associated disassembled fine tuning force coupling apparatus of this invention including side views of retaining elements utilized therein, FIGURE 2 is a side view taken along lines A—A of a rear coupling element of FIGURE 1, FIGURE 3 is a side view taken along line B—B of a program channel indicating disk of FIGURE 1, FIGURE 4 is a side view taken along line C—C of a front coupling element of FIGURE 1, FIGURE 5 is a side view taken along line D—D of a fine tuning control knob of FIGURE 1, FIGURE 6 is a side view taken along line E—E of a program channel tuning knob of FIGURE 1, FIGURE 7 is an enlarged partial view of a televisioin receiver, partly in sectional form, illustrating the tuner and associated fine tuning force coupling apparatus of FIGURE 1 in assembled form, FIGURE 8 is a partially cut-away view of a fine tuning mechanism taken along line F—F of FIGURE 7, FIGURE 9 is a side view of a television receiver cabinet diagrammatically illustrating the positioning of a tuner, numeral indicating disk and control panel therein, and FIGURE 10 is a partial view on an enlarged scale of the control panel of FIGURE 9 taken along lines G—G of FIGURE 9.

Referring now to FIGURE 1, a television receiver program channel tuning apparatus is indicated generally by 10. The apparatus 10 includes means for selecting one of twelve presently available program channels. This selecting means is shown to be a well known rotary switch having wafer switch elements 11 and including electrical elements 12, shown as inductances, mounted upon the wafer elements for tuning the receiver to a desired program channel. Sufficient elements having proper electrical characteristics are provided for selecting individually each of the twelve conventional channels when the switch is rotated into operable position.

A solid cylindrical program channel selector drive shaft 13 is provided for rotating the wafers 11 into operable position for selecting a desired program channel. The shaft 13 is rotatably mounted in bearings 14 and is prevented from moving axially by retaining washes 15. Included on the shaft 13 are grooves 16, 17 and 18 and flattened portions 19 and 20.

Due to variations in the electrical characteristics of the aforementioned program channel selecting electrical elements resulting from initial variation in design center values, from ambient operating conditions and from age, means are conventionally provided for fine tuning the program channel which has been selected. FIGURE 1 illustrates a variable inductance generally designated as 29 which provides this fine tuning function. A coil 30 is provided and wound upon a coil form 31. The coil 30 may be connected in a circuit, such as an oscillator, which is arranged for fine tuning the receiver when the inductance of coil 30 is suitably varied. A magnetic cylindrically shaped core 32 is positioned within the coil form 31 and is connected to a drive shaft 33. The drive shaft 33 is biased to the left in FIGURE 1 by a spring 34 positioned between a wall 35 of the tuning apparatus 10 and a lip 36 mounted near the extremity of the drive shaft. Associated with the lip 36 is a rounded surface 37.

A cylindrically shaped tubular metal shaft segment 50 of a composite fine tuning drive shaft, to be discussed hereinafter, is mounted concentrically with shaft 13. The shaft 50, which is preferably made of aluminum or other substantially non-magnetic material, includes a pair of oppositely positioned slots 51, one of which may be viewed in FIGURE 1, and a fine tuning friction drive disk 52. The disk 52 is connected to shaft 50 by a press fit and is positioned for rotating a circular driven disk 53 when shaft 50 rotates. The driven disk 53 is rotatably mounted on the wall 35 by a rod 54. The driven disk 53 includes a 360° camed surface 55 which bears upon surface 37. Camed surface 55 extends a maximum distance from the surface of disk 53 at point 56. As disk 53 is rotated, the cam surface 55 which bears upon surface 37 forces the core 32 to move to the left or right corresponding to the rotation of shaft 50 thus varying the inductance of coil 30 by increasing permeability. Coil permeability will be maximum when point 56 of surface 55 bears upon surface 37 of rod 33.

In FIGURE 9, the above described apparatus 10 is shown to be positioned in a television receiver cabinet 57 and mounted by a bracket 58 to a chassis 59. FIGURE 7 illustrates in detail the positioning of the apparatus 10 relative to a control panel 60 of the receiver. The program channel selector shaft 13 passes through an aperture 61 in the panel 60. A viewing aperture 62 is provided in the panel 60 and a glass sheet 63 is mounted within the aperture 62. The glass material 63 has a milky appearance but, under certain conditions, as described hereinafter may be a clear glass material. A light source 64 including a socket 65, lamp 66 and bracket 67 for mounting the socket 65 on surface 35 of tuning apparatus 10 is provided.

An opaque numeral disk 68, more full described hereinafter, is mounted on the program channel selector shaft 13 and is rotatable therewith. Numeral shaped apertures 28 corresponding to program channel numbers are disposed in annular form about the disk 68. The numerals are arranged in numerical sequence and the disk is positioned on the shaft in a manner so that the numeral corresponding to a selected program channel is opposite the viewing aperture 62. Light from the source 64 passes through the numeral aperture and the numeral is displayed on the milky glass 63 of viewing aperture 62 for convenient viewing.

In accordance with this invention, a composite tubular drive shaft, concentric with the program channel selector shaft 13, is provided for coupling a rotational fine tuning adjusting force without the receiver cabinet 57 to the fine tuning means in the fine tuning apparatus 10 and for providing unobstructed viewing of the selected channel indication at the viewing aperture 62. Referring once again to FIGURE 1, the components of a composite tubular fine tuning drive shaft are shown in disassembled form. The composite tubular fine tuning drive shaft includes metal tubular shaft segment 50, a clear plastic rear coupling element 70 and a clear plastic front coupling element 71.

The rear coupling element 70 is partially cylindrical shaped and has an inside diameter and a depth, designated by numerals 69 and 103 respectively, of sufficient dimension for positioning numeral disk 68 concentrically within its depth 103. Element 70 is comprised of a substantially transparent plastic material which is conveniently manufactured by a molding process. Although the use of other suitable materials may be apparent to those skilled in the art, a suitable material from which element 70 is molded is styrene-acrylonitrile having the trade name "Lustran-All." This material in untinted form will provide at least 90% light transmission. Element 70 includes a segmented hub 72, structural supporting ribs 73, a pair of rotational force coupling ribs 74, best seen in FIGURE 2, and three coupling tabs 75 formed on the wall surface of the cylindrical portion and spaced equidistant about the wall circumference. The element 70 is positioned concentrically with the shaft segment 50 in a manner so that ribs 74 engage slots 51 of segment 50 for coupling a rotational force. A conventional binding ring 76 is wrapped about the segmented hub 72 for securing the coupling element 70 on the segment 50.

A numeral disk 68, previously referred to, is provided and includes a segmented hub 77 formed on a forward surface 78 of the disk. An inner surface 79 of one of the hub segments is flattened and is best seen in FIGURE 3. A numeral aperture forming the numeral "6" is shown positioned on the disk 68 near its periphery. As has been previously described, additional numeral apertures, not shown, are positioned in annular fashion about the disk. The disk 68 is opaque and is conveniently manufactured by molding the disk from a suitable plastic material. Although the use of other suitable materials may be apparent to those skilled in the art, a suitable material from which disk 68 is molded is black acrylonitrile-butadiene-styrene having the trade name "Cycolac-T." The disk 68 is mounted on the shaft 13 after the coupling element 70 has first been positioned on shaft 13. After coupling element 70 is mounted, a washer 80 is inserted in groove 16 for limiting undesirable axial motion of disk 68. The disk is then mounted within the cylindrical portion of element 70 rearward surface 81 first, in a manner so that hub segment surface 79 mates with flat surface 19 of shaft 13. The disk 68 is positioned intermediate grooves 16 and 17 and a washer 82 is inserted in groove 17 to limit undesirable axial movement of disk 68.

The front coupling element 71 is disk shaped and circular. It has an outside diameter corresponding to the outside diameter of the cylindrical portion of rear coupling element 70. Element 71 includes a hub 90, supporting ribs 91, and coupling slots 92 spaced equidistant about the outside diameter and having a dimension suitable for accepting the tabs 75 of element 70. A portion of hub 92 is formed into a flattened surface 93. The disk 71 is conventiently manufactured in the same manner as element 70 of the same substantially transparent material. Element 71 is positioned on shaft 13 intermediate grooves 17 and 18 and flush with cylinder 70 in a manner so that the three tabs 75 of element 70 engage the three slots 92. A washer 94 is positioned in groove 18 for limiting undesirable axial movement.

The above described tuning appartus 10 and assembled fine tuning coupling appartus is positioned in the receiver 57 as hereinbefore described and illustrated in FIGURES 7 and 9. Fine tuning and channel selection control knobs are then mounted on the respective shafts from without the cabinet.

Referring once again to FIGURE 1, a plastic fine tuning control knob 95 is illustrated having a segmented hub 96 on which an inner surface 97 of one of the segments, best seen in FIGURE 5, is flattened. The hub 95 is mounted concentrically with hub 90 of element 71 from without the cabinet through aperture 61 of control panel 60. Element 71 and knob 95 are aligned in a manner so that the flattened surfaces 93 and 97, respectively, mate. A conventional binding ring 104 is provided and wrapped about hub 96.

A channel selecting force may be applied to shaft 13 via a knob 98 which is provided and is mounted concentrically with shaft 13 from without the cabinet 57. The knob 98 includes a cylindrical hub 99 having a cylindrical apertuer 100. The aperture 100 includes a flattened inner surface 101, best seen in FIGURE 6, and a spring metal retaining element 102. Flattened inner surface 101 mates with flattened surface 20 of shaft 13. The spring element 102 exerts a force between these flattened surfaces for retaining the knob 98 to the shaft 13.

A desired program channel may be selected by rotating the knob 98 until the desired channel indication numeral appears in the viewing window 62. Fine tuning of the selected program channel may conveniently be performed by rotating fine tuning knob 95. The knob 95 may be rotated fully 360° clockwise or counterclockwise. The rotational fine tuning force will be transmitted to disk 52 via the elements 71 and 70, which rotate independently of disk 68, and by shaft segment 50. Since elements 70 and 71 are comprised of transparent materials, the light from source 64 of FIGURE 7 will pass unobstructed to viewing window 62 and will display the numeral at the window 62 as illustrated in FIGURE 10.

Although I have described the disk 68 as being comprised of an opaque material and the window 63 as being comprised of milky glass material, other variations and combinations may occur to those skilled in the art. For example, the material of disk 68 may be a white translucent material and the numerals may be provided by an opaque substance rather than an aperture. Under these circumstances, the window 62 may contain a clear glass and the indication appearing at viewing window 62 would be a dark numeral on a light field rather than the above described light numeral on a dark field.

While I have described a fine tuning force coupling means for use with one system for selecting a program channel and for fine tuning the selected program channel, it will be obvious to those skilled in the art that other channel selecting and fine tuning means may be equally applicable with the present invention. For example, a turret type program channel selecting apparatus may be utilized and a memory fine tuning apparatus may also be utilized in place of the fine tuning means described. Furthermore, the above described invention may conventionally be utilized with known power tuning systems by eliminating knob 98, by shortening the shaft 13 to groove 18, by extending shaft 13 rearward from bearing 14 and by coupling a power tuning drive source and system to the extended shaft 13.

Although I have illustrated and described and pointed out in the annexed claims certain novel features of my invention, it will be understood that various omissions, substitutions and changes in the forms and details of the system illustrated may be made by those skilled in the art without departing from the spirit of the invention and the scope of the claims.

What I claim as new and desire to secure by Letters Patent of the United States is:

1. In a television receiver having an enclosure, a program channel tuning apparatus positioned within said enclosure, said program channel tuning apparatus including means for selecting a desired one of multiple program channels and means for fine tuning a selected program channel, a program channel selector drive shaft rotatably mounted and coupled to said program channel selecting means, an annular indicator disk having forward and rearward surfaces mounted within said enclosure on said program selector drive shaft and rotatable therewith, said disk including means for providing an indication of a program channel selected, means for viewing said indication from without said enclosure, the means for coupling an operable force to said fine tuning means comprising: a composite tubular fine tuning drive shaft, said fine tuning drive shaft positioned concentrically with and about said program channel selector drive shaft and independently rotatable, means for coupling said composite fine tuning drive shaft to said fine tuning means, means for coupling a rotational fine tuning adjusting force to said fine tuning drive shaft, said composite fine tuning drive shaft including indicator disk circumventing means for coupling said rotational fine tuning drive force from a segment of said fine tuning drive shaft forward of said disk forward face to a segment rearward of said disk rearward face and providing unobstructed viewing of said indication of a selected program channel from without said enclosure.

2. The apparatus of claim 1 wherein said composite fine tuning drive shaft is rotatable 360°.

3. The apparatus of claim 1 wherein said indicator disk cirumventing means comprises first and second transparent coupling elements.

4. The apparatus of claim 1 wherein said indicator disk circumventing means comprises a transparent coupling disk and a transparent coupling cylinger.

5. The apparatus of claim 4 wherein said coupling disk and said coupling cylinder include engaging means for coupling a fine tuning rotational force from said disk to said cylinder.

6. The appartus of claim 5 wherein said engaging means comprises slots and tabs.

7. Means for indicating the rotational position of a shaft having a coaxial sleeve and operable from the forward side of a face panel comprising, in combination, a control means mounted on the shaft for rotation therewith, an indicator disk mounted on the shaft at the rear of the panel for rotation therewith, and a control means for the sleeve, said sleeve control means comprising a pair of generally disk shaped members of greater radius than said indicator disk, one on each side of said indicator disk, said sleeve control disks being interlocked adjacent their peripheries, one of said sleeve control disks being fixed on said sleeve for rotation therewith and the other disk having a hub coaxial with said sleeve and shaft and serving as a control knob and extending through the panel to the forward side thereof, said other disk being provided with transparent areas whereby said indicator disk can be viewed through said disk and an indicating window in the panel.

8. Means for indicating the rotational position of a shaft having a coaxial sleeve and operable from the forward slide of a panel comprising, in combination, a control means mounted on the shaft for rotation therewith, an indicator disk mounted on the shaft at the rear of the panel for rotation therewith, and a control means for the sleeve, said sleeve control means comprising a pair of generally disk shaped members of greater radius than said indicator disk, one on each side of said indicator disk, said sleeve control disks being interlocked adjacent their peripheries, one of said sleeve control disks being fixed on said sleeve for rotation therewith and the other disk having a hub coaxial with said sleeve and shaft extending through the panel to the forward side thereof and a control knob mounted on said hub for rotation therewith, said other disk being provided with transparent areas whereby said indicator disk can be viewed through said other disk and a locating window in the panel.

9. An indicating means as claimed in claim 7, wherein said interlocking means comprises a toothed flange on said one sleeve control disk and peripheral teeth on the other said sleeve control disk, said teeth intermeshing.

No references cited.

LOUIS J. CAPOZI, *Primary Examiner.*

ARNOLD RUEGG, C. W. ROBINSON, *Examiners.*